United States Patent [19]

Shannon et al.

[11] Patent Number: 4,903,265

[45] Date of Patent: Feb. 20, 1990

[54] METHOD AND APPARATUS FOR POST-PACKAGING TESTING OF ONE-TIME PROGRAMMABLE MEMORIES

[75] Inventors: Paul D. Shannon, Austin, Tex.; Hiroyuki Oka, Tokyo, Japan; Paul E. Grimme, Dripping Springs; Robert W. Sparks, Austin, both of Tex.

[73] Assignee: Motorola, Inc., Schaumburg, Ill.

[21] Appl. No.: 276,990

[22] Filed: Nov. 28, 1988

Related U.S. Application Data

[62] Division of Ser. No. 119,528, Nov. 27, 1987, Pat. No. 4,809,231.

[51] Int. Cl.$^4$ .................. G01R 31/28; G11C 29/00
[52] U.S. Cl. ........................... 371/21.4; 365/201
[58] Field of Search .................. 371/21, 28, 21.4; 365/201

[56] References Cited

U.S. PATENT DOCUMENTS

| | | | |
|---|---|---|---|
| 4,418,403 | 11/1983 | O'Toole et al. | 365/201 |
| 4,553,225 | 11/1985 | Ohe | 365/201 |
| 4,612,630 | 9/1986 | Rosier | 365/201 |
| 4,718,042 | 1/1988 | Moll et al. | 365/201 |
| 4,779,272 | 10/1988 | Kohda et al. | 371/21 |
| 4,802,166 | 1/1989 | Casagrande et al. | 371/21 |

Primary Examiner—Charles E. Atkinson
Attorney, Agent, or Firm—Jonathan P. Meyer

[57] ABSTRACT

A method and apparatus for post-packaging testing of one-time programmable memories provided means for assuring that each cell of the memory will appear to a customer to be erased and that it is capable of being programmed. The preferred embodiment of the invention is a microcomputer including one-time programmable memory, but the invention also includes memory-only devices. Marginal reading method and apparatus provide for detecting the threshold voltage of memory cells below the level at which the cell appears to the customer to be erased and marginal programming method and apparatus provide for slightly increasing the threshold voltage of cells in order to ensure their programmability.

9 Claims, 5 Drawing Sheets

METHOD AND APPARATUS FOR POST-PACKAGING TESTING OF ONE-TIME PROGRAMMABLE MEMORIES This is a division of Ser. No. 119,528, filed Nov. 27, 1987, now U.S. Pat. No. 4,809,231, issued Feb. 28, 1989.

FIELD OF THE INVENTION

The present invention relates, in general, to a method and apparatus for post-packaging testing of one-time programmable (OTP) memories. More particularly, the invention relates to a method and apparatus for marginally programming ultraviolet erasable, programmable read-only memories (UV EPROMs) in order to verify the functionality thereof.

BACKGROUND OF THE INVENTION

UV EPROMs are commonly used semiconductor memory devices into which data may be written and which then retain the stored information indefinitely. Such memories may also be erased by exposure to ultraviolet light, rewritten and reused. A disadvantage of UV EPROMs is that they must be packaged in expensive packages with UV-transparent windows in order to allow the ultraviolet light to reach the memory cells.

Recently, a market has been created for OTP memory devices. OTP memories are UV EPROMs packaged in inexpensive plastic packages without windows. They may, of course, be programmed and used as any other UV EPROM, but may never be erased, rewritten and reused. For a variety of applications, OTP memories are cost competitive with mask-programmable memories, which OTP's resemble functionally. In addition to memory-only devices, microcomputers and other integrated circuit products which include OTP memory have become successful. As used hereinbelow, the term OTP memories will include both memory-only devices and devices in which memory is integrated with other circuits, such as a microcomputer.

Testing of OTP memories during the manufacturing process is particularly difficult. While the devices are still in the form of wafers or die, prior to being irreversibly sealed into plastic packages, they may be fully tested. That is, each memory cell may be programmed, read and erased to ensure its functionality. Since there is, as yet, no package surrounding the device, exposing it to ultraviolet light is no problem. However, once an OTP memory is packaged, it has not been possible to perform a test which guarantees that each cell is still capable of functioning. Since the packaging process involves one or more steps at relatively high temperatures, and perhaps other potentially damaging steps, there are always some memory cells which pass all tests prior to packaging, but which fail when a customer attempts to use the device.

One partial solution to the problem of post-packaging testing of OTP memories is to include "extra" memory cells in each device. These extra cells are tested after packaging and it is assumed that if the extra cells are good, the remainder are also good. Obviously, some bad memories will still pass final inspection if such a test method is relied upon.

SUMMARY OF THE INVENTION

Accordingly, it is an object of the present invention to provide a method and apparatus for post-packaging testing of OTP memories.

Yet another object of the present invention is to provide a method and apparatus for verifying the functionality of each cell in an OTP memory after the memory has been packaged.

Still a further object of the present invention is to provide a method and apparatus for marginally programming UV EPROM cells in order to verify the functionality thereof, but without destroying the usefulness thereof.

These and other objects and advantages of the present invention are provided by a method of post-packaging testing of one-time programmable memories comprising the steps of determining a post-packaging threshold voltage of a cell of said memory; rejecting said memory if said post-packaging threshold voltage is above a minimum rated supply voltage; applying a programming voltage to said cell for a predetermined time; determining a new threshold voltage of said cell; determining whether said new threshold voltage is above said post-packaging threshold voltage; rejecting said memory if said new threshold voltage is above said minimum rated supply voltage; and accepting said memory if said new threshold voltage is above said post-packaging threshold voltage.

DETAILED DESCRIPTION OF THE INVENTION

The terms "assert", "assertion", "negate" and "negation" will be used to avoid confusion when dealing with a mixture of "active high" and "active low" signals. "Assert" and "assertion" are used to indicate that a signal is rendered active, or logically true. "Negate" and "negation" are used to indicate that a signal is rendered inactive, or logically false. In addition, the terms "write" and "writing" will refer to the act of storing information into a memory. Since each bit of information stored may be either a one or a zero, some of the memory cells so "written" will remain in an erased state. The terms "program" and "programming", on the other hand, will refer to the act of changing the state of a memory cell from its erased state to its unerased, or programmed, state.

Each cell of an EPROM comprises a floating gate transistor device. The state, either programmed or erased, of a cell is determined by its threshold voltage $V_t$. When a cell is read, a voltage slightly less than the power supply voltage of the device, $V_{DD}$, is applied to the control gate of the floating gate transistor. If the transistor "turns on", that is, if a conductive path opens between the source and drain of the transistor, it is said to be erased. In other words, the control gate voltage $V_{CG}$ is higher than the threshold voltage for erased cells. Any cell with a threshold voltage higher than $V_{DD}$ does not turn on when read and is said to be programmed. The threshold voltage of a cell may be increased by applying a large programming voltage $V_{PP}$ between the source and drain in order to generate very energetic charge carriers in the channel and by attracting those carriers to the floating gate by applying $V_{PP}$ to the control gate.

In the case of an OTP memory, the manufacturer's testing methods should ensure two things for each cell. First, each cell must read as erased when the customer receives the memory. Second, each cell must be capable of being programmed.

Figure 1:
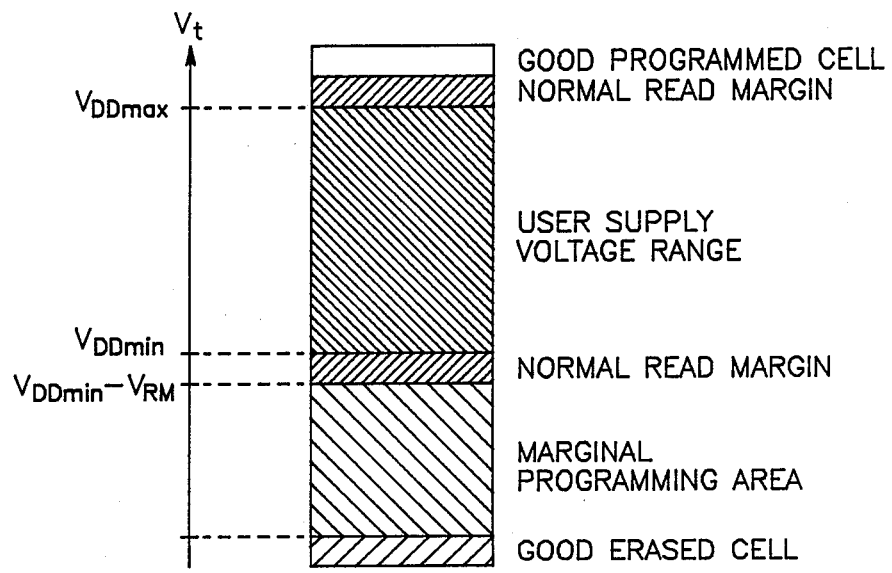
FIG. 1 is a diagram illustrating the threshold voltage range for an EPROM cell.

FIG. 1 illustrates the possible range of $V_t$ for an EPROM cell. For any commercial device, the manufacturer will specify a range, $V_{DDmin}$ to $V_{DDmax}$, within which the device is guaranteed to function. Thus, the manufacturer must design the memory's read circuitry, primarily the sense amplifier, to assure that any cell with a threshold voltage below $V_{DDmin}$ will read as erased and that any cell with a threshold voltage above $V_{DDmax}$ will read as programmed. In practice, a read margin voltage, $V_{RM}$, is used by the manufacturer in the design and test of the memory. The effect of $V_{RM}$ is to expand the $V_{DDmin}$ to $V_{DDmax}$ range by perhaps 500 millivolts on either end. This implies that, in order to ensure that each cell initially reads as erased, the manufacturer must ensure that the threshold voltage of each cell is less than $V_{DDmin}$ minus $V_{RM}$ when the memory is shipped. The design of the cell is typically such that, for a good cell, the erased threshold voltage will be substantially less than $V_{DDmin}$ minus $V_{RM}$. In some cases, there may be as much as 1 Volt or more of "extra" margin available. This implies that there exists a region, labeled here the marginal programming area, within which the threshold voltage of a cell may be raised from the completely erased state without appearing to the customer to be programmed. The description below illustrates a particular embodiment of a method and apparatus for verifying, after an OTP memory is packaged, that each cell is both erased and is programmable by varying its threshold within this marginal programming region.

Figure 2:
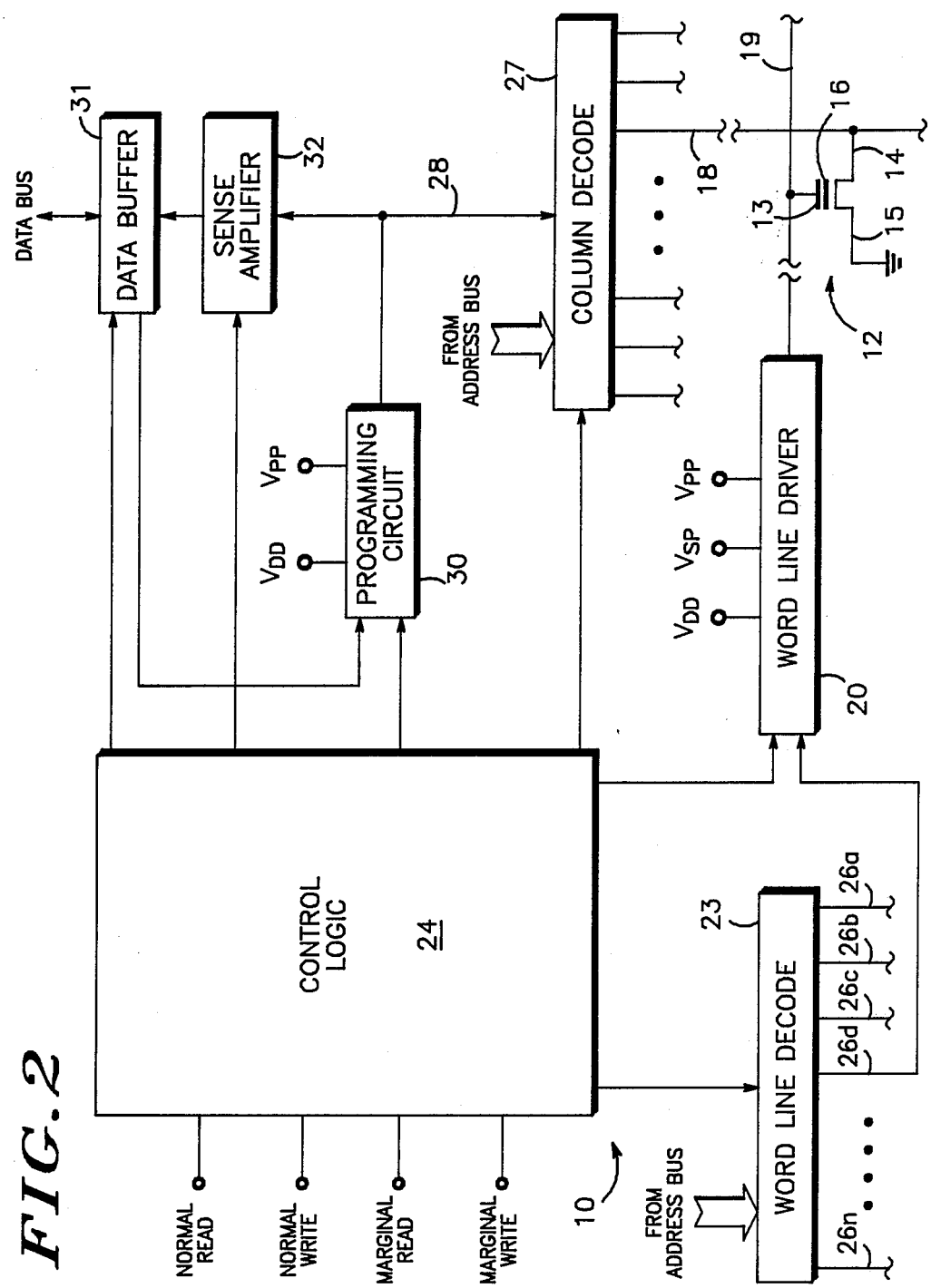
FIG. 2 is a block diagram illustrating a particular embodiment of the present invention.

FIG. 2 is a block diagram illustrating a memory device 10 of a particular embodiment of the present invention. In the preferred embodiment, device 10 comprises a portion of an integrated circuit microcomputer which is intended to be packaged in a window-less plastic package. Device 10 includes an array of EPROM cells, represented here by a single cell 11. Each cell comprises a floating gate transistor 12 having a control gate 13, a drain 14, a source 15 and a floating gate 16. Source 15 is connected to ground. Drain 14 is coupled to a bit line 18 and control gate 13 is coupled to a word line 19.

A word line driver is coupled to word line 19. Word line driver 20 is provided with three power supply voltages, $V_{DD}$, $V_{PP}$ and $V_{SP}$. As mentioned above, $V_{DD}$ is the standard positive power supply voltage for device 10 and is typically in the range of 3 to 5 Volts. $V_{PP}$ is the standard programming voltage for device 10 and is typically in the range of 7 to 25 Volts. Both $V_{DD}$ and $V_{PP}$ are supplied to device 10 by means of pins dedicated to that purpose. $V_{SP}$, on the other hand, is a special test voltage which is only supplied to device 10 when the testing method of the present invention is being practiced. In the preferred embodiment, the microcomputer of which device 10 forms a part has several special operating modes useful for testing. In one or more of these special test modes, a pin which is normally used for some other purpose is, instead, coupled to word line driver 20 and is used by an external testing apparatus to supply $V_{SP}$ thereto. As is described in detail below, the value of $V_{SP}$ varies depending on the test being performed and may range from nearly zero to nearly $V_{PP}$.

Word line driver 20 receives inputs from a word line decoder 23 and control logic 24. Word line driver 20 is described in greater detail with reference to FIG. 3.

Word line decode 23 receives inputs from an address bus and from control logic 24 and produces outputs on a plurality of word line driver lines 26a–26n. One of the word line driver lines, 26d in this example, is connected to word line driver 20.

A column decode apparatus 27 receives inputs from the address bus and from control logic 24. Column decode 27 is coupled to a plurality of bit lines, of which bit line 18 is one. In response to the address received, column decode couples one of the bit lines to a data line 28. In the preferred embodiment, which is a byte-wide memory, there are actually eight data lines, to which eight different bit lines are simultaneously coupled, so as to produce an eight bit output word. However, for simplicity, this description will assume a bit-wide memory having only a single data line 28. The extension to other organizations will be apparent to one skilled in the art.

A programming circuit 30 is coupled to data line 28. Programming circuit 30 receives inputs from control logic 24 and from a data buffer 31. Programming circuit 30 also is provided with the $V_{DD}$ and $V_{PP}$ supply voltages. The purpose of programming circuit 30 is to, when appropriate, apply the programming voltage $V_{PP}$ to data line 28. Programming circuit 30 is described in greater detail with reference to FIG. 4, below.

A sense amplifier 32 is also coupled to data line 28. Sense amplifier 32 receives inputs from control logic 24 and provides an output to data buffer 31. Sense amplifier 32 is described in greater detail with reference to FIG. 5, below.

Data buffer 31 receives inputs from sense amplifier 32 and control logic 24 and provides outputs to a data bus and to programming circuit 30.

Control logic 24 performs the task of providing control signals to direct the timing and operation of each of the other elements of device 10 according to the function being performed. The function to be performed is determined by four inputs to control logic 24: normal read, normal write, marginal read and marginal write. The first two, of course, are the functions used by a customer in using device 10. The second two are functions, accessible only to the manufacturer, useful in testing each cell after device 10 has been packaged. The table below summarizes the voltages applied to a selected EPROM cell for each of these functions.

|  | NORM. READ | NORM. PROGRAM | MARG. READ | MARG. PROG. |
|---|---|---|---|---|
| $V_{drain}$ | (S.A.) | $\sim V_{PP}$ | (S.A.) | $\sim V_{PP}$ |
| $V_{CG}$ | $\sim V_{DD}$ | $\sim V_{PP}$ | $\sim V_{SP}$ | $\sim V_{PP}(V_{SP})$ |

In each case illustrated in the table, the actual voltage applied to the drain or control gate will differ from the respective supply voltage due to threshold drops occurring in the intervening circuits.

In both the normal and marginal read functions, the drain of the selected cell is coupled to the input of sense amplifier 32, obviously. As will be described below, sense amplifier 32 performs differently in the two read modes. In addition, the control gate voltage in the marginal read mode is $V_{SP}$, rather than $V_{DD}$, as is also further described below. The normal and marginal program functions are similar in terms of the voltages applied, differing primarily in the length of time the programming voltages are applied. Optionally, in order to provide better control over the rate at which programming takes place during the marginal programming mode, it may be desirable to apply $V_{SP}$ to the control gate during that process.

Figure 3:
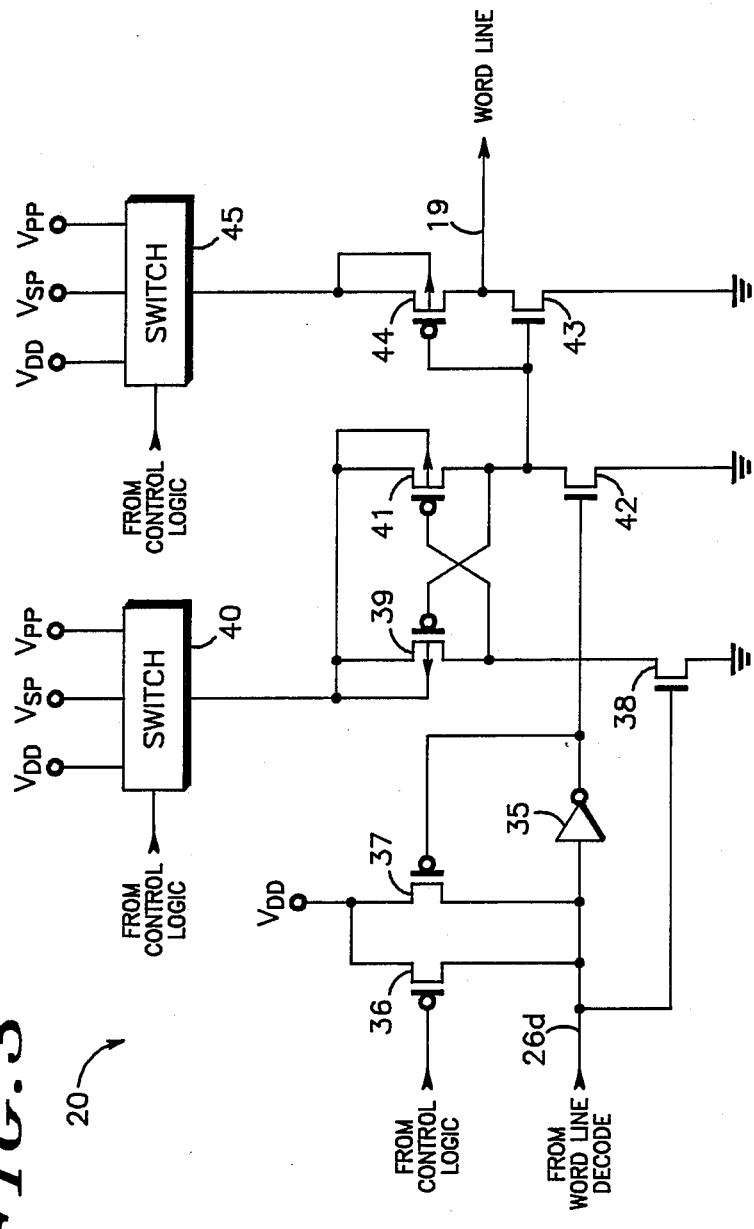
FIG. 3 is a schematic diagram illustrating the word line driver circuit of FIG. 2.

FIG. 3 illustrates word line driver circuit 20. There is, of course, one word line driver circuit for each word line in device 10. The basic function of word line driver circuit 20 is to respond to an active low word line select signal from word line decode 23, an active high strobe signal from control logic 24 and voltage select control signals from control logic 24 to apply the selected voltage ($V_{DD}$, $V_{SP}$ or $V_{PP}$) to word line 19.

Line 26d from word line decode 23 is connected to an input of an inverter 35. The drains of a first P-channel transistor 36 and a second P-channel transistor 37 are connected to line 26d, also. The sources of transistors 36 and 37 are coupled to $V_{DD}$. The gate of transistor 36 is coupled to the active high strobe signal from control logic 24. The gate of transistor 37 is connected to the output of inverter 35. Thus, when both the strobe signal and the word line select signal are active, the output of inverter 35 is high.

A gate of a first N-channel transistor 38 is connected to line 26d. A source of transistor 38 is coupled to ground. A drain of transistor 38 is connected to a drain of a third P-channel transistor 39. A source of transistor 39 is coupled to a first high voltage switch 40. High voltage switch 40 is provided with $V_{DD}$, $V_{SP}$ and $V_{PP}$ and, responsive to inputs from control logic 24, applies one of the three voltages to the source of transistor 39. The output of high voltage switch 40 is also coupled to a source of a fourth P-channel transistor 41, whose gate is connected to the drain of transistor 39 and whose drain is connected to the gate of transistor 39. The drain of transistor 41 is also connected to a drain of a second N-channel transistor 42. A gate of transistor 42 is connected to the output of inverter 35 and a source of transistor 42 is coupled to ground.

The drain of transistor 42 is also connected to the gates of a third N-channel transistor 43 and of a fifth P-channel transistor 44. A source of transistor 43 is coupled to ground. A drain of transistor 43 is connected to a drain of transistor 44. A source of transistor 44 is coupled to the output of a second high voltage switch 45, which performs the same function as does high voltage switch 40. Word line 19 is connected to the drains of transistors 43 and 44.

As described above, word line driver 20 merely applies the voltage selected by control logic 24 from among $V_{DD}$, $V_{SP}$ and $V_{PP}$ to word line 19 when both the strobe signal and the word line select signal are active.

Figure 4:
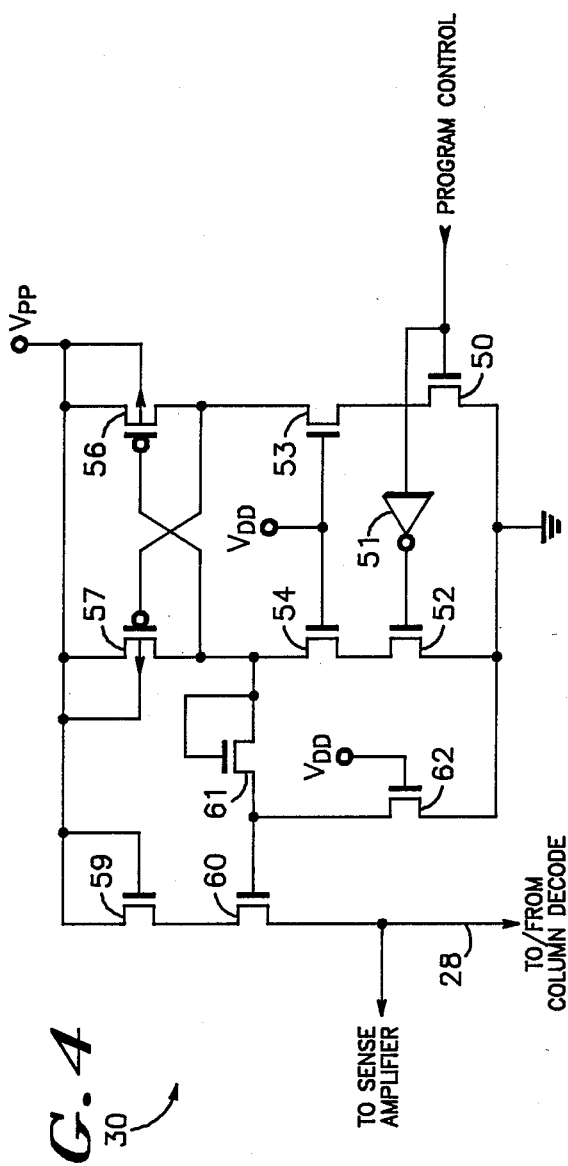
FIG. 4 is a schematic diagram illustrating the programming circuit of FIG. 2.

FIG. 4 illustrates programming circuit 30. Circuit 30 is responsive to an active high program control signal to apply the programming voltage $V_{PP}$ to bit line 28. The program control signal is a logical combination of a control signal from control logic 24 and the output of data buffer 31. The control signal is active when either a normal or a marginal write is being performed and the signal from data buffer 31 is active, indicating that a 1 is contained therein.

The program control signal is applied to a gate of a first N-channel transistor 50 and to the input of an inverter 51. The output of inverter 51 is connected to a gate of a second N-channel transistor 52. The sources of transistors 50 and 52 are coupled to ground. A drain of transistor 50 is connected to a source of a third N-channel transistor 53 and a drain of transistor 52 is connected to a source of a fourth N-channel transistor 54. The gates of transistor 53 and 54 are coupled to $V_{DD}$.

A drain of transistor 53 is connected to a drain of a first P-channel transistor 56 and to a gate of a second P-channel transistor 57. A drain of transistor 54 is connected to a drain of transistor 57 and to a gate of transistor 56. The sources of transistors 56 and 57 are coupled to $V_{PP}$. A fifth N-channel transistor 59 has its drain and gate coupled to $V_{PP}$. A source of transistor 59 is connected to a drain of a sixth N-channel transistor 60. A source of transistor 60 is connected to bit line 28. A gate of transistor 60 is connected to a source of a seventh N-channel transistor 61. A gate and a drain of transistor 61 are connected to the drain of transistor 54. The gate of transistor 60 is also connected to a drain of an eighth N-channel transistor 62. A gate of transistor 62 is coupled to $V_{DD}$ and a source of transistor 62 is coupled to ground.

When the program control signal is active, data line 28 is coupled to $V_{PP}$. Otherwise, transistor 60 isolates data line 28 from $V_{PP}$.

Figure 5:
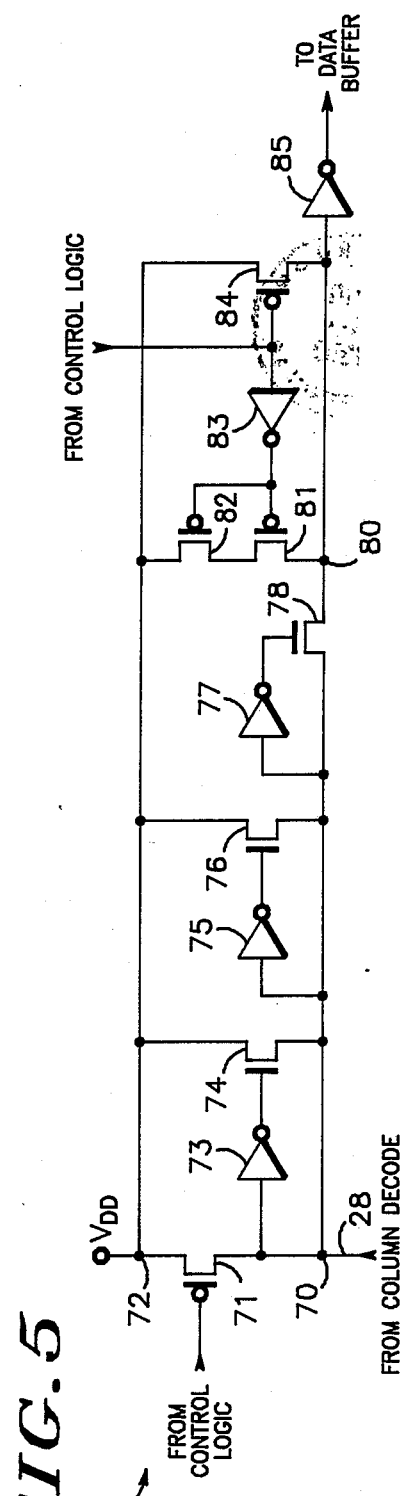
FIG. 5 is a schematic diagram illustrating the sense amplifier circuit of FIG. 2.

FIG. 5 illustrates sense amplifier 32 of FIG. 2. Sense amplifier 32 is a dual range, current sensing sense amplifier. In its low range, sense amplifier 32 requires a relatively higher current to sense and in its high range it is capable of sensing relatively lower currents. Data line 28 is connected to a node 70 of sense amplifier 32. A P-channel pre-charge transistor 71 has a drain connected to node 70 and a source connected to a node 72 of sense amplifier 32. A gate of transistor 71 is coupled to control logic 24. Node 72 is coupled to $V_{DD}$. Transistor 71 is an optional feature of sense amplifier 32 and is used briefly prior to a read to raise the voltage of node 70 so that transistors 74, 76 and 78 are non-conductive.

A first inverter 73 has an input connected to node 70 and an output connected to a gate of a first N-channel transistor 74. A drain of transistor 74 is connected to node 72 and a source of transistor 74 is connected to node 70. A second inverter 75 also has an input connected to node 70. The output of inverter 75 is connected to a gate of a second N-channel transistor 76, which has a source connected to node 70 and a drain connected to node 72. A third inverter 77 also has an input connected to node 70 and has an output connected to a gate of a third N-channel transistor 78. Transistor 78 has a source connected to node 70 and a drain connected to a node 80 of sense amplifier 32.

A drain of a P-channel transistor 81 is connected to node 80. A source of transistor 81 is connected to a drain of P-channel transistor 82, whose source is connected to node 72. The gates of transistors 81 and 82 are connected to an output of an inverter 83. The input of inverter 83 is connected to a range control signal from control logic 24. The range control signal is also connected to a gate of a P-channel transistor 84, which has a drain connected to node 72 and a source connected to node 80. When the range control signal is high, transistors 81 and 82 will be conductive and sense amplifier 32 will be in its high range. When the range control sinal is low, transistor 84 will be conductive and sense amplifier will be in its low range. An inverter 85 has an input connected to node 80 and an output coupled to data buffer 31 of FIG. 2.

Inverters 73, 75, 77 and 85 have successively higher switch points. That is, the input voltage at or near which the output switches from one state to the other is highest for inverter 85 and lowest for inverter 73. In the steady state, the voltage of node 70 will tend to stabilize at a level just above the switch point of inverter 77. Transistor 71 may be activated briefly to raise the voltage of node 70 a bit higher to ensure that inverters 73, 75 and 77 all have low outputs. Node 80 will tend to stabilize near $V_{DD}$, well above the switch point of inverter 85. Thus, the output of inverter 85 is low.

Prior to a read, either marginal or normal, each bit line is discharged to ground. Then, the column decode couples the selected bit line to node 70. Transistor 71 is non-conductive at this point. The voltage of node 70 drops quickly to a level below the switch points of inverters 73, 75 and 77, turning on transistors 74, 76 and 78 and coupling nodes 72 and 80 to node 70. Current flows from node 72 to node 70, charging up the relatively large capacitance represented by the bit line and raising the voltage of node 70. Shortly thereafter, the read voltage, either $V_{DD}$ or $V_{SP}$, is coupled to the control gate of the selected cell.

Inverter 73 and transistor 74 are a speed-up stage intended to increase the speed at which the voltage of node 70 is raised initially. Transistor 74 is sized so as to provide a relatively strong coupling between nodes 72 and 70. Inverter 73 has a relatively lower switch point, so that after the initial charging is accomplished, transistor 74 is turned off.

Inverter 75 and transistor 76 are a bias stage intended to balance the current flowing through the selected memory cell if the control gate voltage is at or below the threshold voltage of the cell; that is, if the cell is programmed. In this case, the current flowing through either transistors 81 and 82 or through transistor 84, depending on the range control signal, will be available to raise the voltage of node 80 to a point above the switch point of inverter 85, whose output will return to a low state. The output of inverter 85 is latched at a suitable time after the beginning of the read process, in order to allow time for all the intervening events to occur.

If the threshold voltage of the selected cell is slightly lower in relation to the control gate voltage than in the case described above, the current flowing through transistor 76 will not be sufficient to balance the cell current. Some or all of the current flowing into node 80 will flow through transistor 78 to balance the cell current. If the cell current is sufficiently high, node 80 will remain below the switch point of inverter 85 and the output of inverter 85 will remain high when it is latched, indicating that the cell is erased.

The sizes of transistors 81, 82 and 84 are chosen so that node 80 is more weakly coupled to node 72 through the combination of transistors 81 and 82 than through transistor 84. This arrangement provides that the current flowing into node 80 from node 72 is lower in magnitude in the high range of sense amplifier 32 than in the low range thereof. In other words, it requires a lower cell current to overcome the ability of transistors 81 and 82 to charge node 80 than it requires to to overcome the ability of transistor 84 to do so.

In the preferred embodiment of the present invention, the low range of sense amplifier 32 is utilized for marginal reads and the high range is used for normal reads. Thus, the manufacturer is able to raise the cell threshold high enough, through the use of short, marginal programming pulses, so that the cell will read as programmed when a marginal read is used, but the cell will still read as erased to a user applying a normal read.

Figure 6:
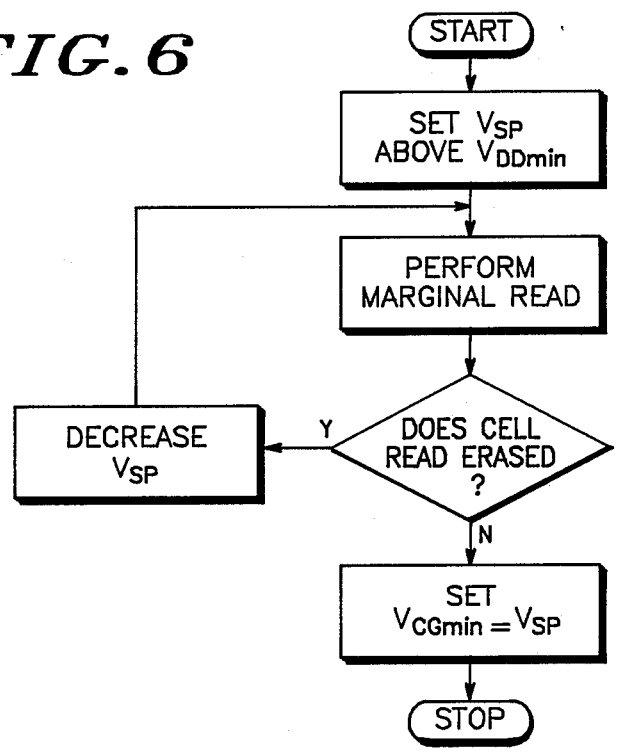
FIG. 6 is a flow chart illustrating a portion of a method of operating the apparatus of FIGS. 2-5.
Figure 7:
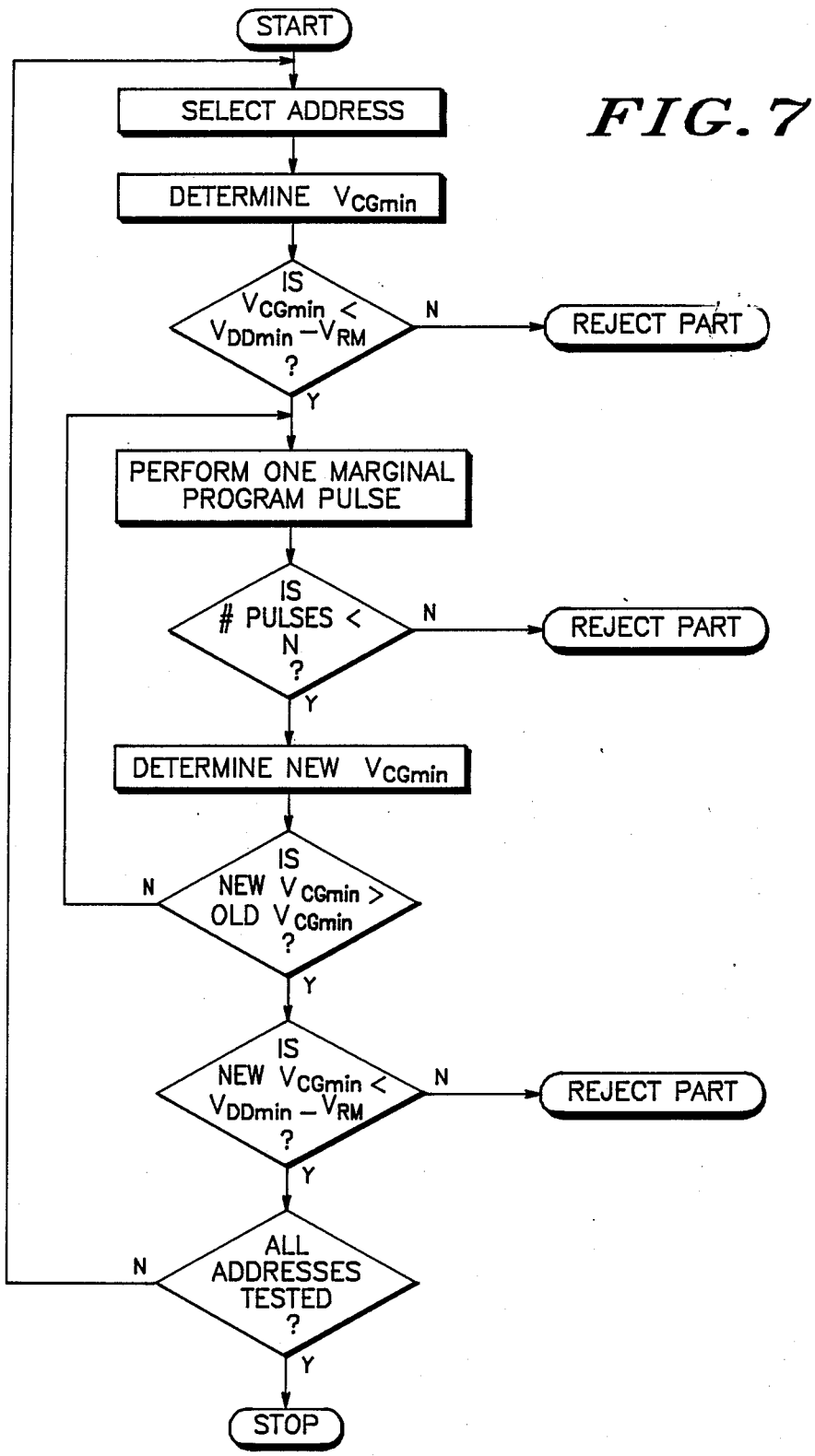
FIG. 7 is a flow chart illustrating a method of operating the apparatus of FIGS. 2-5.

Referring now to FIGS. 6 and 7, a method of operating the apparatus of FIGS. 2-5 is disclosed. The method of FIGS. 6 and 7 is designed to ensure both that each cell of a memory array is erased and that it is capable of being programmed. It should be clear that, for the most part, the method disclosed is to be performed by a conventional integrated circuit tester with appropriate programming.

The method disclosed is intended to be applied to memory devices which have been packaged; that is, which can no longer be erased by exposure to ultraviolet light. Most commonly, the memory cells will have been exhaustively tested prior to being packaged at what is referred to as the probe stage. After probe, the memory cells are thoroughly erased prior to being packaged. Therefore, it is assumed that, except for defective cells, each cell enters the disclosed process in a thoroughly erased state.

FIG. 6 illustrates a method for finding a value referred to as $V_{CGmin}$. This method is used several times during the test procedure. $V_{CGmin}$ is the maximum control gate voltage which, when applied to the cell being tested, results in an output indicating that the cell is programmed. At the start, the tester, which controls the value of $V_{SP}$, sets $V_{SP}$ to some starting value which is higher than $V_{DDmin}$. Next, a marginal read is performed. In other words, $V_{SP}$ is applied to the control gate of the selected memory cell and the sense amplifier is set to its low sensitivity range. The tester examines the contents of the data buffer to determine whether the cell reads as programmed or erased. If the cell reads as erased, the tester decreases the value of $V_{SP}$ and repeats the marginal read process. This cycle is continued until the cell reads as programmed; that is, until the value of $V_{SP}$ is sufficiently lower than the threshold voltage of the cell that there is insufficient cell current to trigger the sense amplifier.

As is apparent, the method of FIG. 6 is a method of determining the threshold voltage of a cell by slowly approaching it from above. The amount by which the tester decrements $V_{SP}$ between successive marginal reads will determine both the accuracy and the time consumed by the $V_{CGmin}$ location method. A decrement value in the range of approximately 20 to 250 milliVolts is thought to be generally appropriate.

FIG. 7 illustrates the entire method of operating the apparatus of FIGS. 2-5 to test each cell. First, an address is selected. If, as in the detailed embodiment disclosed above, the memory being tested is bit-organized, each address will access and test just one cell. If, however, as is more commonly the case, the memory being tested is byte-organized, eight cells will be accessed and tested for each address selected.

Once a location is selected, the address is supplied to the memory being tested and the method of FIG. 6 is used to determine $V_{CGmin}$. This, in effect, determines the threshold voltage of the cell or cells being tested as those devices came out of the packaging process. This value is first compared by the tester to $V_{DDmin}$ minus $V_{RM}$, the minimum power supply voltage specified for the device minus the normal read margin. In order to ensure that the cell or cells being tested will appear to the customer as being erased, $V_{CGmin}$ must be less than $V_{DDmin}$ minus $V_{RM}$. If this is not the case, the part is rejected and the test is terminated.

If $V_{CGmin}$ is less than $V_{DDmin}$ minus $V_{RM}$, then the tester directs the memory to perform a marginal program pulse. In other words, the tester loads the data buffer with ones and asserts the marginal write input to the control logic of the memory. The tester has control over the time duration of the marginal program pulse by virtue of the length of time that the marginal write control signal is asserted. The duration of the marginal program pulse is chosen so as to minimally move the threshold of the cell up. A duration in the range of 50 to 500 microseconds is thought to be generally appropriate.

In the preferred embodiment, the memory device controller responds to the marginal program signal from the tester by applying $V_{PP}$ to both the control gate and the drain of each cell being accessed. It is possible that, in some cases, a greater degree of control will be desired over the rate at which charge is transported onto the floating gate during marginal programming. In this case, the word line driver can be directed to apply $V_{SP}$, rather than $V_{PP}$, to the control gate. By varying $V_{SP}$, the tester can then influence the rate at which the threshold is increased during a marginal programming pulse.

After each marginal programming pulse, the tester compares the total number of pulses applied to the particular cell under test to some maximum number N. N is chosen to be small enough so that one can be confident that even if N marginal programming pulses are applied, the threshold of a good cell which started out fully erased will not be increased to a value greater than $V_{DDmin}$. Of course, N will depend on the time duration of each marginal programming pulse, the rate at which the threshold moves during each pulse and the total marginal programming area available between the fully erased state and $V_{DDmin}$. It is thought that a value of N less than 10 is generally appropriate.

If the total number of marginal programming pulses has not yet reached N, the tester once again performs the method of FIG. 6 to determine a new value of $V_{CGmin}$. This, in effect, determines a new threshold voltage value for the cell or cells being tested. Next, the new value of $V_{CGmin}$ is compared to the old value (the value determined prior to the start of marginal programming pulses) to determine whether the threshold voltage of the cell or cells has been raised. It is possible to perform this comparison in such a way that the threshold must have increased by some minimum amount in order to pass the test. If the threshold has not been increased, another marginal programming pulse is applied and the comparison repeated. Once it is detected that the threshold of a cell or cells has been raised by the marginal programming pulses, the new threshold value is compared, once again, to $V_{DDmin}$ minus $V_{RM}$ to ensure that the cell or cells will still appear to the customer to be erased. If the threshold voltage is too high, the part is rejected and the test is terminated. If not, the cell or cells being tested are determined to be good and testing moves on to the next address.

When all addresses have been tested, and assuming that the part was not rejected along the way, it can be said that each memory cell in the part is both erased and capable of being programmed. The confidence with which one can conclude that a cell whose threshold was capable of being raised some small amount is also capable of having its threshold raised by the larger amount necessary to allow a customer to program it is quite high. This confidence is increased by the fact that each cell was proven to be capable of being completely programmed prior to packaging.

An OTP memory device tested according to the disclosed method can be delivered to a customer, who will use the part only for normal reading and writing of data and will not have access to the marginal reading and programming functions, with confidence that the part will perform fully. As is apparent, an apparatus and method have been disclosed above which provide for the post-packaging testing of OTP memory devices. The method and apparatus is equally applicable to both memory-only devices and to microcomputers and the like which have OTP memories included therewith. Other than the disclosed modifications to the design of the memory itself, the only apparatus required to perform the disclosed method is a conventional integrated circuit tester.

While the present invention has been shown and described with reference to a particular embodiment thereof, various modifications and changes thereto will be apparent to one skilled in the art and are within the spirit and scope of the present invention. For example, the disclosed apparatus provides two methods of controlling both the marginal reads and the marginal writes. In the case of the marginal reads, both the control gate voltage and the sense amplifier sensitivity are controllable. In the case of marginal writes, both the time duration and the control gate voltage are controllable with the disclosed apparatus. It may be found to be adequate in some circumstances to eliminate some of these controls. For instance, it is possible that adequate performance is achievable if only the sense amplifier sensitivity is different between normal and marginal reads, without altering the control gate voltage. As is apparent, selecting one or more, but less than all of the disclosed controls for a particular application does not alter the invention disclosed and claimed herein.

We claim:

1. A method of post-packaging testing of one-time programmable memories comprising the steps of:
    determining a post-packaging threshold voltage of a cell of said memory;
    rejecting said memory if said post-packaging threshold voltage is above a minimum rated supply voltage;
    applying a programming voltage to said cell for a predetermined time;
    determining a new threshold voltage of said cell;
    determining whether said new threshold voltage is above said post-packaging threshold voltage;
    rejecting said memory if said new threshold voltage is above said minimum rated supply voltage; and
    accepting said memory if said new threshold voltage is above said post-packaging threshold voltage.

2. A method according to claim 1 further comprising the steps of:
    repeating said steps of applying a programming voltage and determining a new threshold voltage up to a predetermined number of times if said new threshold voltage is not above said post-packaging threshold voltage; and rejecting said memory if, after said predetermined number of repetitions, said new threshold voltage is not above said post-packaging threshold voltage.

3. A method according to claim 2 wherein said predetermined time of application of said programming voltage is substantially less than a second predetermined time of application of said programming voltage, which second predetermined time is intended to change a state of said cell from erased to programmed.

4. A method according to claim 1 wherein said step of determining a post-packaging threshold further comprises the steps of:

applying a predetermined voltage to a control gate of said cell;

coupling a sense amplifier to said cell;

detecting, with said sense amplifier, if a current flows through said cell in response to said predetermined voltage applied to said control gate;

responding to the absence of a current detected by said sense amplifier by decreasing said predetermined voltage and repeating said steps of applying, coupling and detecting; and responding to the presence of a current detected by said sense amplifier by concluding that said post-packaging threshold is approximately equal to a current value of said predetermined voltage.

5. A method of testing a semiconductor memory having a memory cell which has a variable threshold voltage which may be increased, but not decreased after packaging, and which is designed to be operated by a user with a supply voltage in the range of $V_{DDmin}$ to $V_{DDmax}$, the method comprising the steps of:

determining an initial threshold voltage of said cell;

rejecting said memory if said initial threshold voltage is above $V_{DDmin}$;

attempting to increase the threshold voltage of said cell;

determining a new threshold voltage of said cell;

determining if said new threshold voltage is above said initial threshold voltage; and accepting said memory if said new threshold voltage is above said initial threshold voltage and below $V_{DDmin}$.

6. A method according to claim 5 further comprising the steps of:

repeating said steps of attempting to increase said threshold voltage and determining a new threshold voltage up to a predetermined number of times if said new threshold voltage is not above said initial threshold voltage; and rejecting said memory if said, after said predetermined number of repetitions, said new threshold voltage is not above said initial threshold voltage.

7. A method according to claim 5 wherein said threshold voltage may be decreased prior to packaging said memory and wherein the method further comprises the step of:

attempting to decrease said threshold voltage prior to packaging said memory.

8. A method according to claim 5 wherein said threshold voltage may be increased to a value above $V_{DDmax}$ by the application of a programming voltage for a first predetermined time and wherein said step of attempting to increase said threshold voltage further comprises the step of:

applying a programming voltage for a second predetermined time less than said first predetermined time.

9. A method according to claim 5 wherein said memory further comprises a sense amplifier for sensing a current through said cell and for determining whether a voltage applied to a control gate of said cell is above said threshold voltage and wherein the step of determining an initial threshold voltage further comprises the steps of:

applying a predetermined voltage to said control gate;

coupling said sense amplifier to said cell;

operating said sense amplifier to determine whether said predetermined voltage is above said threshold voltage;

responding to a determination that said predetermined voltage is above said threshold voltage by decreasing said predetermined voltage and repeating said steps of applying, coupling and operating; and responding to a determination that said predetermined voltage is not above said threshold voltage by concluding that said threshold voltage is approximately equal to said predetermined voltage.

* * * * *